United States Patent [19]
Jakowetz et al.

[11] Patent Number: 5,923,053
[45] Date of Patent: *Jul. 13, 1999

[54] LIGHT-EMITTING DIODE HAVING A CURVED SIDE SURFACE FOR COUPLING OUT LIGHT

[75] Inventors: Wolf Jakowetz, Vaterstetten; Helmut Fischer, Regensburg, both of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/723,975

[22] Filed: Sep. 30, 1996

[30] Foreign Application Priority Data

Sep. 29, 1995 [DE] Germany ............... 195 36 438

[51] Int. Cl.$^6$ ................................................ H01L 33/00
[52] U.S. Cl. ............................................................. 257/95
[58] Field of Search ............................. 257/94, 95, 97, 257/98, 100

[56] References Cited

U.S. PATENT DOCUMENTS

| 5,250,466 | 10/1993 | Gerner et al. |
| 5,349,211 | 9/1994 | Kato ................................... 257/95 |

FOREIGN PATENT DOCUMENTS

| 1062821 | 8/1959 | Germany. |
| 41 13 969 A1 | 11/1992 | Germany. |
| 4305296A1 | 8/1994 | Germany. |
| 985450 | 3/1965 | United Kingdom. |
| 1471116 | 4/1977 | United Kingdom. |

*Primary Examiner*—David B. Hardy
*Attorney, Agent, or Firm*—Herbert L. Lerner; Laurence A. Greenberg

[57] ABSTRACT

A semiconductor component includes a semiconductor body having a front side, a rear side and at least one curved side surface. As viewed from outside the semiconductor body, the at least one curved side surface is convex adjacent the rear side and concave adjacent the front side. The rear side has a greater area than the front side. A method is also provided for producing a plurality of the semiconductor components.

6 Claims, 4 Drawing Sheets

LIGHT-EMITTING DIODE HAVING A CURVED SIDE SURFACE FOR COUPLING OUT LIGHT

BACKGROUND OF THE INVENTION

FIELD OF THE INVENTION

The invention relates to a semiconductor component having a semiconductor body with a front side, a rear side and at least one curved side surface.

A method for producing such semiconductor components according to the prior art is complicated and bears the risk of breaking the semiconductor body during sawing. The prior art method is described in greater detail below with regard to FIGS. 3 and 4.

SUMMARY OF THE INVENTION

It is accordingly an object of the invention to provide a semiconductor component and a production method, which overcome the hereinafore-mentioned disadvantages of the heretofore-known products and methods of this general type and which improve such a semiconductor body and simplify the method for producing it, with the result that, in particular, the risk of the semiconductor body breaking during sawing is reduced. At the same time, a further aim is to improve a coupling out of light in the case of semiconductor bodies for light-emitting diodes.

With the foregoing and other objects in view there is provided, in accordance with the invention, a semiconductor component, comprising a semiconductor body having a front side, a rear side and at least one curved side surface; as viewed from outside the semiconductor body, the at least one curved side surface being convex adjacent the rear side and concave adjacent the front side; and the rear side having a greater area than the front side.

In accordance with another feature of the invention, the curved side surface is convex up to a first thickness of the semiconductor body and the first thickness is greater than half the total thickness of the semiconductor body. In accordance with a further feature of the invention, particularly in the case of light-emitting semiconductor bodies, this advantageously results in a distinct improvement in the coupling out of light, since the semiconductor body is very like a calotte.

In accordance with an added feature of the invention, there is provided a plastic encapsulation applied directly to the semiconductor body, which is preferably transparent to light.

In accordance with an additional feature of the invention, the semiconductor component is a light-emitting diode, and the semiconductor body is formed of III/V semiconductor material.

In accordance with yet another feature of the invention, the rear side of the semiconductor body is reflective.

With the objects of the invention in view there is also provided a method for producing a plurality of semiconductor components, which comprises applying one side of a prefabricated semiconductor wafer to a carrier; applying at least two mutually separated etching masks to another side of the semiconductor wafer opposite the one side applied to the carrier; severing the semiconductor wafer into at least two parts after the application of the etching masks; subsequently isotropically etching parts still secured on the carrier to produce an undercut of the etching masks, and subsequently processing the parts further to form semiconductor components.

With the objects of the invention in view there is additionally provided a method for producing a plurality of semiconductor components, which comprises producing a semiconductor wafer having a front side and a rear side; applying a plurality of front side contacts to the semiconductor wafer in accordance with a predetermined grid pattern; applying a rear side contact to the semiconductor wafer; applying a plurality of mutually separated etching masks covering the front side contacts and part of the front side of the semiconductor wafer; securing the semiconductor wafer on a carrier; separating the semiconductor wafer between the etching masks into chips in such a way that the chips remain on the carrier in their previous disposition; isotropically etching the chips to undercut the etching masks; removing the etching masks; detaching the chips from the carrier; and further processing chips to form semiconductor components.

Other features which are considered as characteristic for the invention are set forth in the appended claims.

Although the invention is illustrated and described herein as embodied in a semiconductor component and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
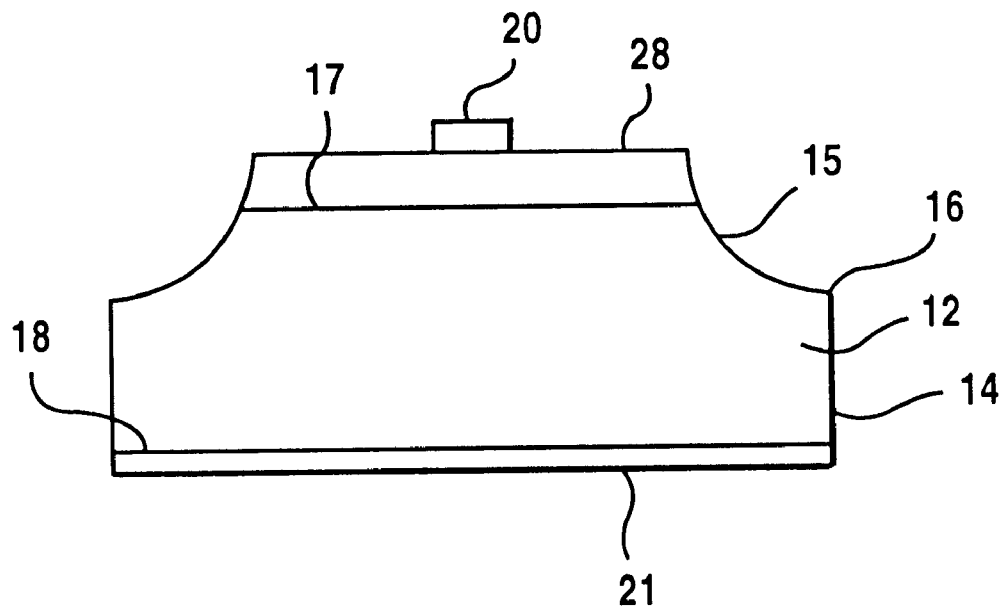
FIG. 3 is a cross-sectional view of a semiconductor body having a mesa structure according to the prior art.

Referring now to the figures of the drawings in detail and first, particularly, to FIG. 3 thereof, there is seen a diagrammatic illustration of a cross-section through a semiconductor body 12 having a mesa structure. Semiconductor bodies 12 of that type are used in light-emitting diodes, for example. The characteristic feature of the mesa structure is curved side surfaces 15, which at one end adjoin a front side 28 and at the other end adjoin planar side surfaces 14.

In light-emitting diodes, semiconductor bodies 12 which are shaped in that way and allow radiation produced by the light-emitting diode to pass bring about improved coupling out of light produced in the light-emitting diode, in comparison with light-emitting diodes having a parallelepipedal semiconductor body, and thus an increased external quantum efficiency (equal to the number of protons leaving the light-emitting diode per unit of time/the number of charges transported through the light-emitting diode per unit of time). That is due to the fact that, in comparison with a parallelepipedal semiconductor body, in the case of the semiconductor body 12 described above, significantly more of the light which is emitted from a pn junction 17 of the semiconductor body 12 in the direction of the rear side 18 and is reflected there impinges on the surface of the semiconductor body 12 at an angle which is less than the critical angle of total reflection. Reflection and absorption losses in the semiconductor body are distinctly reduced as a result thereof.

Figure 4:
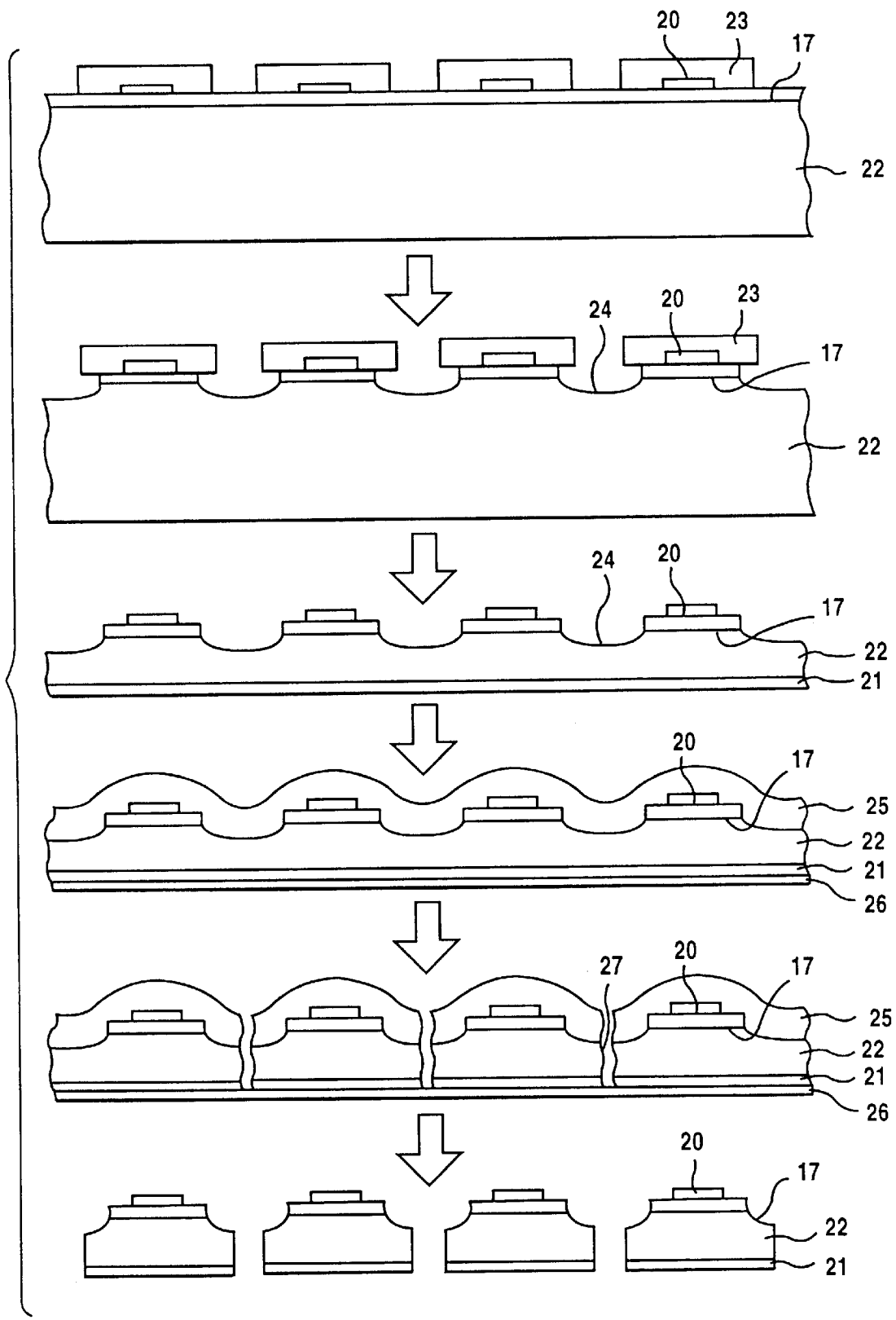
FIG. 4 is a group of six fragmentary, cross-sectional views illustrating a sequence of a method for producing a semiconductor body according to FIG. 3.

A method for producing a semiconductor body 12 having the geometry described above is diagrammatically illustrated in FIG. 4. First contact metallization layers 20 and then a plurality of etching masks 23 are applied to a front side of a semiconductor wafer 22 having a pn junction 17. A plurality of mesa trenches 24 are then isotropically etched into the semiconductor wafer 22 by using a suitable etchant. A suitable etchant for a semiconductor wafer 22 being formed of GaAs and/or GaAlAs is, for example, a $H_2SO_4$/$H_2O_2$/$H_2$ solution (mixture ratio 3:1:1). Subsequently, the etching masks 23 are removed, the semiconductor wafer 22 is thinned to its final thickness and a contact metallization layer 21 is applied to a rear side 18 of the semiconductor wafer 22. The surface of the semiconductor wafer 22 and the contact metallization layers 20 are subsequently covered with a protective layer 25, for example photoresist, silicon oxide or silicon nitride. The semiconductor wafer 22 is then secured on a carrier 26, for example a plastic adhesive film, and subsequently separated into chips, for example by sawing. The separation is followed by a further etching step, the so-called chip surface or flank etching. In that etching process, semiconductor material on cut surfaces 27, which is damaged during the separation of the semiconductor wafer 22, is removed. The last step is to remove the chips from the carrier 26.

In the above-described method for producing semiconductor bodies 12 having a mesa structure, the risk of the semiconductor wafer 22 breaking during sawing is extremely high, since the wafer thickness in the mesa trenches 24 is very low.

In addition, in the case of semiconductor bodies for light-emitting diodes, although the coupling out of light from the above-described semiconductor body 12 is distinctly increased in comparison with the coupling out of light of a parallelepipedal semiconductor body, the external quantum efficiency of a light-emitting diode having a semiconductor body 12 shaped in that way is still very low. Specifically, a large part of the light emitted from the pn junction 17 in the direction of the rear side 18 and reflected there still impinges on the surface of the semiconductor body 12 at an angle which is greater than the critical angle of total reflection. That light is therefore reflected anew into the interior of the semiconductor body 12.

Figure 1:
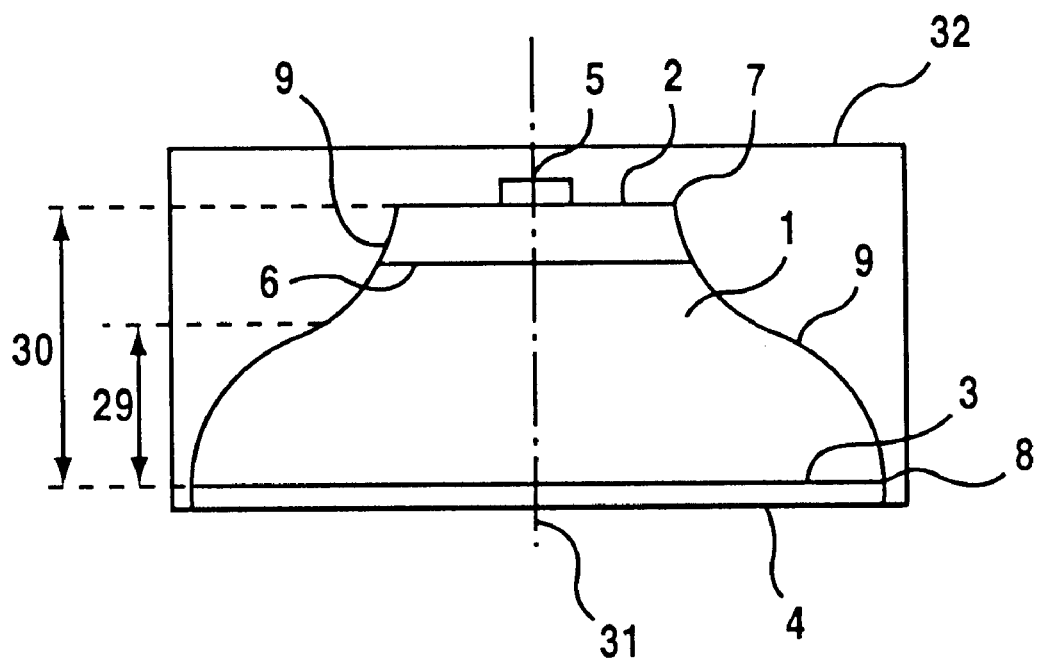
FIG. 1 is a diagrammatic, cross-sectional view of an exemplary embodiment of a semiconductor body according to the invention.

FIG. 1 shows a semiconductor body 1 according to the invention which is formed, for example, of GaAs or another III/V semiconductor material and which has a pn junction 6, a front side contact 5, a rear side contact 4, a front side 2, a rear side 3 and a curved side surface 9. The pn junction 6 is formed, for example, through the use of Si and/or Zn doping. The contacts 4 and 5 are made, for example, of aluminum, gold or another suitable metallic material. As seen from the outside, the curved side surface 9 is concave adjacent the front side 2 and convex adjacent the rear side 3. The semiconductor body 1 has a respective sharp edge 7, 8 only at a transition from the front side 2 to the side surface 9 and at a transition from the rear side 3 to the side surface 9. The rear side contact 4 can be constructed to be reflective (for example polished) and to cover the entire rear side 3 or only partial regions of the rear side 3. The front side contact 5 covers only a small part in the center of the front side 2. In order to improve the reflection properties of the rear side with regard to the use as a light-emitting diode, the rear side of the semiconductor body may advantageously be polished or coated with a reflection-enhancing material, for example $Si_3N_4$. The semiconductor body 1 may also have a directly applied plastic encapsulation 32 which is preferably transparent to light.

In the exemplary embodiment, the curved side surface 9 is convex up to a first thickness 29 of the semiconductor body 1, wherein the first thickness 29 is greater than half a total thickness 30 of the semiconductor body 1. However, it is equally possible for the first thickness 29 to be less than or equal to half the total thickness 30.

A light-emitting diode having a semiconductor body 1 shaped in this way has a higher external quantum efficiency than a light-emitting diode having a semiconductor body 12 according to FIG. 3. Specifically, significantly less of the light radiation which is emitted from the pn junction 6 in the direction of the rear side 3 of the semiconductor body and is reflected there is totally reflected into the semiconductor body 1 from the curved side surface 9, which is similar to a calotte, than is the case with the semiconductor body 12 of FIG. 3. The reason for this, in comparison with the semiconductor body 12 of FIG. 3, is that in the case of the semiconductor body 1, a significantly larger part of the surface of the semiconductor body 1 is oriented in such a way that the light radiation reflected from the rear side 3 impinges on the surface of the semiconductor body 1 at an angle which is less than the critical angle of total reflection. The light losses are therefore distinctly less in the case of the semiconductor body 1 according to the invention.

As an option, it may also be provided that the semiconductor body 1 according to the invention is not curved over the entire side surface 9, but rather only a partial region or a plurality of partial regions of the side surface 9, for example partial areas of the side surface 9 situated opposite one another with regard to a mid-perpendicular 31, are curved. The production method described below must then be correspondingly adapted, for example by suitable masking.

Figure 2:
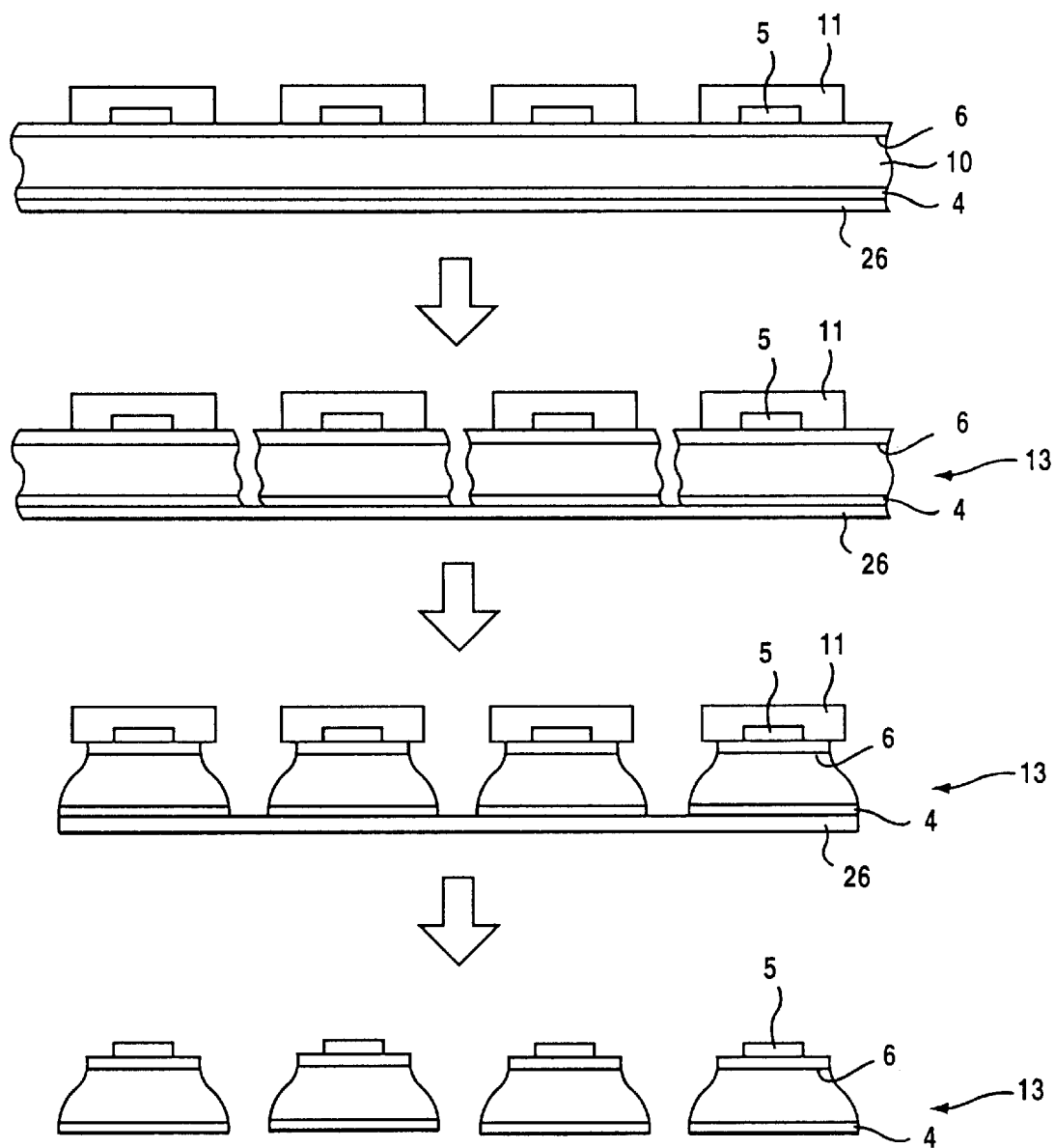
FIG. 2 is a group of four fragmentary, cross-sectional views illustrating a sequence of a method for producing a plurality of semiconductor bodies according to FIG. 1.

A plurality of semiconductor bodies 1 with respective rear and front side contacts 4 and 5 according to FIG. 1 can be produced simultaneously by using a production method illustrated diagrammatically in FIG. 2. This method has the following successive method steps:

a) production of a semiconductor wafer 10 having a whole-area pn junction 6, for example GaAs:Si/GaAs;

b) thinning of the semiconductor wafer 10 to a final thickness, for example through the use of grinding;

c) application of a plurality of the front side contacts 5 in accordance with a predetermined grid pattern and application of the rear side contact 4, in each case through the use of vapor deposition, for example;

d) application of a plurality of etching masks 11, for example being formed of photoresist, in accordance with the predetermined grid pattern;

e) securing the semiconductor wafer 10 on a carrier 26;

f) separation of the semiconductor wafer 10 in accordance with the predetermined grid pattern into a plurality of chips 13;

g) isotropic etching of the chips 13 using, in the case of a semiconductor wafer 10 made of GaAs or AlGaAs, for example, an etching solution of phosphoric acid, $H_2O_2$ and $H_2O$ with a mixture ratio of 1:2:3 or of sulfuric acid, $H_2O_2$ and $H_2O$ with a mixture ratio of 3:1:1;

h) removal of the etching masks 11; and i) detachment of the chips 13 from the carrier 26.

Instead of a semiconductor wafer 10 having a whole-area pn junction 6, it is equally possible, in step a), to produce a semiconductor wafer 10 having pn junctions which are locally indiffused in accordance with a predetermined grid pattern. A suitable dopant is Zn, for example. Steps b) to i) remain identical.

The method according to the invention has two advantages over the mesa technique described above and diagrammatically illustrated in FIG. 4:

Firstly, the semiconductor wafer has the same thickness at all points during the critical process steps "thinning of the semiconductor to the final thickness" and "separation of the semiconductor wafer". As a result, the breaking strength is distinctly higher than in the case of the conventional mesa technique according to FIG. 4. In the conventional mesa technique, the breaking rate in the method steps following the mesa etching is very high due to the small thickness of the semiconductor wafer 22 prevailing in the mesa trenches.

Secondly, one etching step is dispensed with in the method according to the invention. The shaping of the side surfaces and the removal of the semiconductor material at the cut surfaces, which has been damaged during separation, take place in a single etching step. The production outlay is therefore distinctly lower in the case of the method according to the invention than in the case of the conventional method.

The above-described semiconductor body according to the invention and the associated production method are not exclusively restricted to use in light-emitting diodes, but can be employed in all semiconductor bodies having mesa surfaces or flanks, such as bipolar transistors, for example.

We claim:

1. A light emitting diode semiconductor component, comprising:

a semiconductor body having a front side, a rear side and at least one curved side surface;

as viewed from outside said semiconductor body, said at least one curved side surface being convex adjacent said rear side and concave adjacent said front side;

said rear side being reflective and having a greater area than said front side; and said semiconductor body having a total thickness and a given thickness being greater than half of said total thickness, and said at least one curved side surface being convex up to said given thickness.

2. The semiconductor component according to claim 1, wherein said semiconductor body has a shape similar to a calotte.

3. The semiconductor component according to claim 1, including a plastic encapsulation applied directly to said semiconductor body.

4. The semiconductor component according to claim 1, wherein said semiconductor body is formed of III/V semiconductor material.

5. The semiconductor component according to claim 4, including a plastic encapsulation being applied directly to said semiconductor body and being transparent to light.

6. A light emitting diode semiconductor component, comprising:

a semiconductor body having a front side, a rear side and at least one curved side surface;

said at least one curved side surface having a convex shape adjacent said rear side and a concave shape adjacent said front side;

said at least one curved side surface having an inflection point; and said rear side being reflective and having a greater area than said front side.

* * * * *